(12) United States Patent
Kim et al.

(10) Patent No.: US 9,097,742 B2
(45) Date of Patent: Aug. 4, 2015

(54) MULTI-FUNCTIONAL MEASURING AND WAVEFORM-GENERATING EQUIPMENT WITH PROBE

(71) Applicant: INJE UNIVERSITY INDUSTRY-ACADEMIC COOPERATION FOUNDATION, Gyeongsangnam-do (KR)

(72) Inventors: Nam Tae Kim, Busan (KR); Tae Kyoung Hwang, Gyeonggi-do (KR); Jeong Ho Lee, Gyeongsangnam-do (KR); Sung Jin Kim, Gyeongsangnam-do (KR)

(73) Assignee: INDE UNIVERSITY INDUSTRY-ACADEMIC COOPERATION FOUNDATION (KR)

( * ) Notice: Subject to any disclaimer, the term of this patent is extended or adjusted under 35 U.S.C. 154(b) by 103 days.

(21) Appl. No.: 14/104,885

(22) Filed: Dec. 12, 2013

(65) Prior Publication Data

US 2015/0054496 A1    Feb. 26, 2015

(30) Foreign Application Priority Data

Aug. 22, 2013    (KR) .......................... 10-2013-0099649

(51) Int. Cl.
*G01R 11/04*    (2006.01)
*G01R 15/12*    (2006.01)
*G01R 31/28*    (2006.01)

(52) U.S. Cl.
CPC .......... *G01R 15/125* (2013.01); *G01R 31/2841* (2013.01)

(58) Field of Classification Search
CPC ........................ G01R 15/125; G01R 31/2841
USPC ............ 324/157, 76.11, 500, 754.03–754.07, 324/754.31, 600, 631, 637, 645, 76.12; 702/121–127, 189, 190, 85, 108
See application file for complete search history.

(56) References Cited

U.S. PATENT DOCUMENTS 8,451,155 B2 *    5/2013    Amemiya et al. ............. 341/135
2007/0262799 A1 *    11/2007    Nagata .......................... 327/158

FOREIGN PATENT DOCUMENTS

JP    2007-278977    10/2007
JP    2013-117420    6/2013
KR    10-2009-0068903 A    6/2009

*Primary Examiner* — Melissa Koval
*Assistant Examiner* — Trung Nguyen
(74) *Attorney, Agent, or Firm* — Blakely Sokoloff Taylor & Zafman

(57) ABSTRACT

There is provided a Multi-functional measuring and waveform-generating equipment with a probe. The equipment is capable of measuring element values of electric or electronic devices and electrical quantities such as a voltage, and generating electrical signals with various waveforms. Also, a user can conveniently manipulate and handily carry it. The equipment provides functions of measuring a voltage, a resistance, an inductance, capacitance, a frequency, the number of pulses, and the voltage level of a logic signal; verifying diode polarities, measuring the voltage level of a pulse signal, and modes generating a rectangular pulse train and a PWM signal by the simple combinations of two switches. Additionally, it also offers a much cheaper equipment than other existing expensive apparatuses, and provide better usability at experimental environments because it is small-sized, light, and conveniently portable, compared to conventional equipments that are large-sized, heavy, and not easy to carry.

7 Claims, 6 Drawing Sheets

13: pin socket
13a: (+) pole socket
13b: (−) pole socket

FIG. 4a

Volt

FIG. 4b res

FIG. 4c

Coil

FIG. 4d

Cap

FIG. 4e

Freq

FIG. 4f

Cnt

FIG. 4g

Prob

FIG. 4h]

diod

FIG. 4i

PuLS

FIG. 4j

Sqr

MULTI-FUNCTIONAL MEASURING AND WAVEFORM-GENERATING EQUIPMENT WITH PROBE

CROSS-REFERENCE TO RELATED APPLICATIONS

This application claims the benefit under 35 U.S.C. §119(a) of Korean Patent Application No. 10-2013-0099649, filed on Aug. 22, 2013, in the Korean Intellectual Property Office, the entire disclosure of which is incorporated herein by reference for all purposes.

BACKGROUND

1. Field

The present disclosure relates to a Multi-functional measuring and waveform-generating equipment, and more specifically, relates to a Multi-functional measuring and waveform-generating equipment with a probe configured to be capable of generating signals with various waveforms, and measuring element values of electric or electronic devices and electrical quantities such as a voltage and a current. Also, the equipment can easily be manipulated and provide convenient portability, compared to existing conventional equipments.

2. Description of Related Art

The measuring equipment is roughly classified into circuits for measuring electrical quantities such as a voltage, a current, an electric power, a resistance, impedance, admittance, and an inductance, and circuits for measuring non-electrical quantities such as a rotation angle, a position, pressure, a magnetic field, temperature, humidity, gas, and ions, according to measurement purposes or quantities to be measured.

As a conventional art related to the above, Korean Patent Application Publication No. 1999-0070234 discloses a digital apparatus for testing Multi-functions.

The digital multi-meter according to the disclosed art, may be configured to select a measurement range of current to be adjusted into high or small range, in order for direct current or alternating current values to be measured accurately using a microcontroller; and may be configured to display a measured value in the selected range on a display device using numbers.

However, the measuring apparatus of the conventional art as above had problems of low portability and occupying big space when being used, because it is big and heavy.

Further, the apparatus of the conventional art had a problem that several functions for measuring a voltage, a resistance, an inductance, capacitance, a frequency, the number of pulses, and the voltage level of a logic signal; and distinguishing diode polarities, measuring the voltage level of a pulse signal; and generating a rectangular pulse train and a pulse width modulation (PWM) signal cannot be provided in one apparatus.

SUMMARY

The present disclosure is to overcome the above-mentioned problems of the conventional art, and it has an objective to provide easy manipulation and convenient portability as well as multi-functions to measure electrical quantities and generate various signals. Multi-functional measuring and waveform-generating equipment with a probe can measure element values of electric or electronic devices, and electrical quantities such as a voltage and a current, and generate signals with various waveforms using a single equipment.

To accomplish the above-mentioned objective, the Multi-functional measuring and waveform-generating equipment with a probe according to an exemplary embodiment of the present disclosure comprises:

a measuring/waveform-generating terminal unit including:
  a probe protruding from a front side of a body, connected with (+) pole of an object to be measured in measurement modes and providing (+) pole in waveform-generating modes;
  pincers extended from a side of the body using a wire, connected with (−) pole of the object to be measured in measurement modes and providing (−) pole in waveform-generating modes; and
  a pin socket connected with the probe and the pincers electrically, providing the same functions as the functions that the probe and the pincers offer;

an operation-mode setting unit receiving commands for turning a power on/off, and changing and setting an operation mode of the equipment by a user;

a microcontroller, controlling the operation mode for the measurement of the object to be measured connected through the measuring/waveform-generating terminal unit and for the generation of a waveform thereof, according to the commands that is input from the operation-mode setting unit; and a display unit, displaying an operation mode controlled by the microcontroller, a set value, a measured electrical quantity and information for a generated waveform.

The operation mode, input from operation-mode setting unit and controlled by the microcontroller comprises:

modes for measuring a voltage, a resistance, an inductance, capacitance, a frequency, the number of pulses, the voltage level of a logic signal; distinguishing diode polarities, measuring the voltage level of a pulse signal, generating a rectangular pulse train and generating a PWM signal.

The operation-mode setting unit comprises:

a power switch turning a power on/off; and a first and a second switches for changing and setting an operation mode, selecting any one among modes for measuring a voltage, a resistance, an inductance, capacitance, a frequency, the number of pulses, and the voltage level of a logic signal; distinguishing diode polarities, measuring the voltage level of a pulse signal, generating a rectangular pulse train, and generating a PWM signal, with combinations of the switches.

The body is formed in a long stick shape, the power switch is installed on a back side of the body, and the display unit, and the first and the second switches for changing and setting an operation mode are formed in such a way that the display unit is located on the front side of the body and that the switches face each another on the both sides of the body.

The microcontroller comprises:

an analog to digital converter (ADC), converting an analogue signal which is input from the object to be measured into a digital signal;

a timer/counter, generating a timer interrupt and detecting pulses that are input to the measuring/waveform-generating terminal unit, according to the installed program in the microcontroller; and an operation section, configured to:

calculate a voltage, a resistance, an inductance, capacitance, the number of pulses, the voltage level of a logic signal, the voltage level of a pulse signal, a frequency and a voltage across a diode, based on a measured signal from the object to measured that is input to the ADC, and generate a rectangular pulse train and a PWM signal to the measuring/waveform generating terminal unit, by using signals from the timer/counter.

The display unit may display an operation mode at a measuring moment and a set value on 7-segments or else.

According to the Multi-functional measuring and waveform-generating equipment with a probe of the present disclosure configured as above, it provides various functions of measuring a voltage, a resistance, an inductance, capacitance, a frequency, the number of pulses, the voltage level of a logic signal; and distinguishing diode polarities, measuring the voltage level of a pulse signal, generating a rectangular pulse train, and generating a PWM signal, with combinations of the two switches. It can also provide a small-sized equipment that is much more cost effective, compared to existing other expensive equipments.

Further, the present disclosure configured as above provides a Multi-functional measuring and waveform-generating equipment that is convenient to carry and use at experimental environments because it is small-sized and light, unlike existing equipments that are not easy to carry and use because they are large-sized and heavy.

BRIEF DESCRIPTION OF THE DRAWINGS

FIGS. 4a to 4k illustrate plan views of each operation status for various operation modes of the present disclosure.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Hereinafter, exemplary embodiments of the present disclosure will be described in detail by referring to the attached Drawings.

Figure 1:
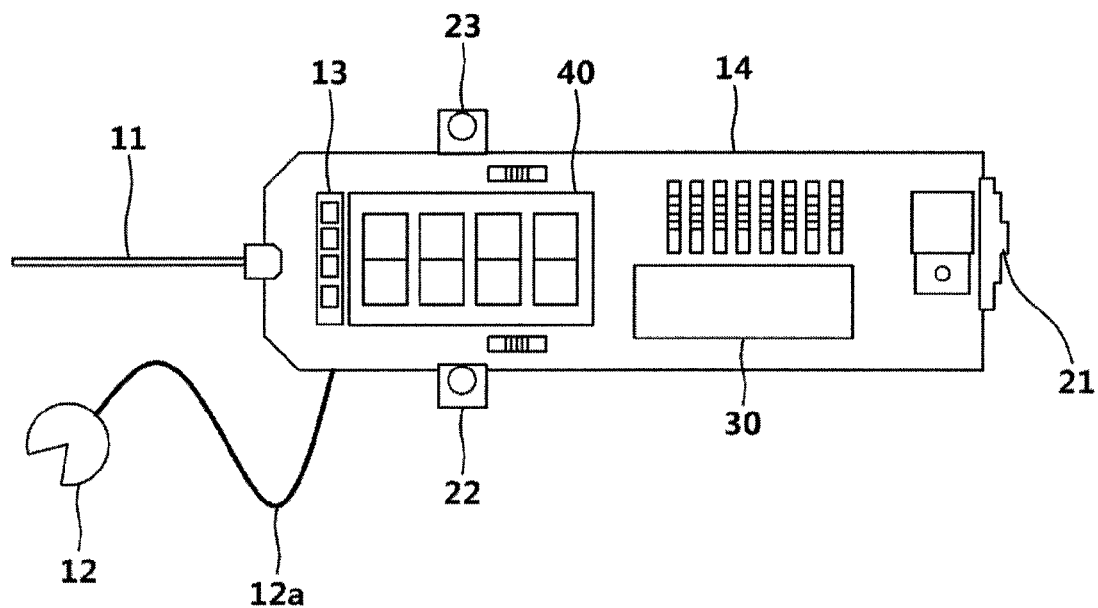
FIG. 1 illustrates a plan view of a Multi-functional measuring and waveform-generating equipment with a probe according to an exemplary embodiment of the present disclosure.
Figure 2:
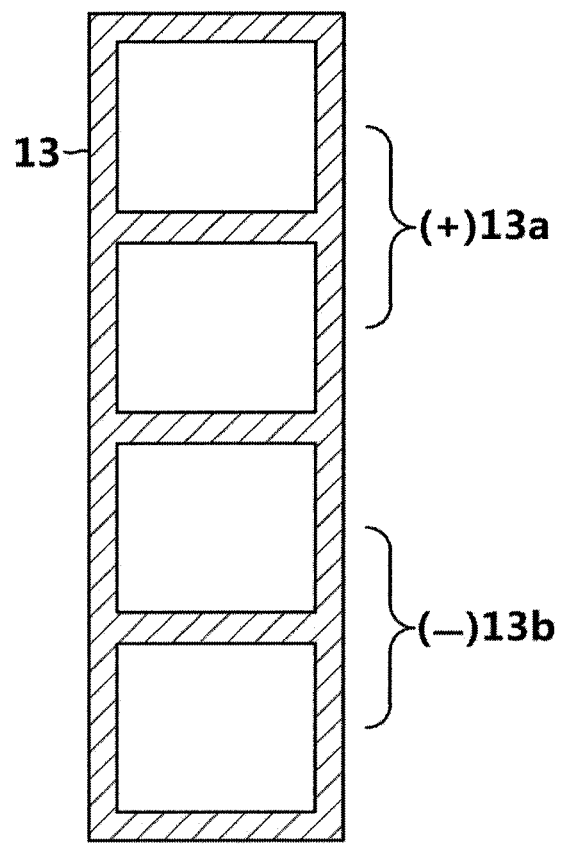
FIG. 2 illustrates a detailed view of a pin socket illustrated in FIG. 1.

FIG. 1 illustrates a plan view of a Multi-functional measuring and waveform-generating equipment with a probe according to an exemplary embodiment of the present disclosure;

FIG. 2 illustrates a detailed view of a pin socket illustrated in FIG. 1; and

Figure 3:
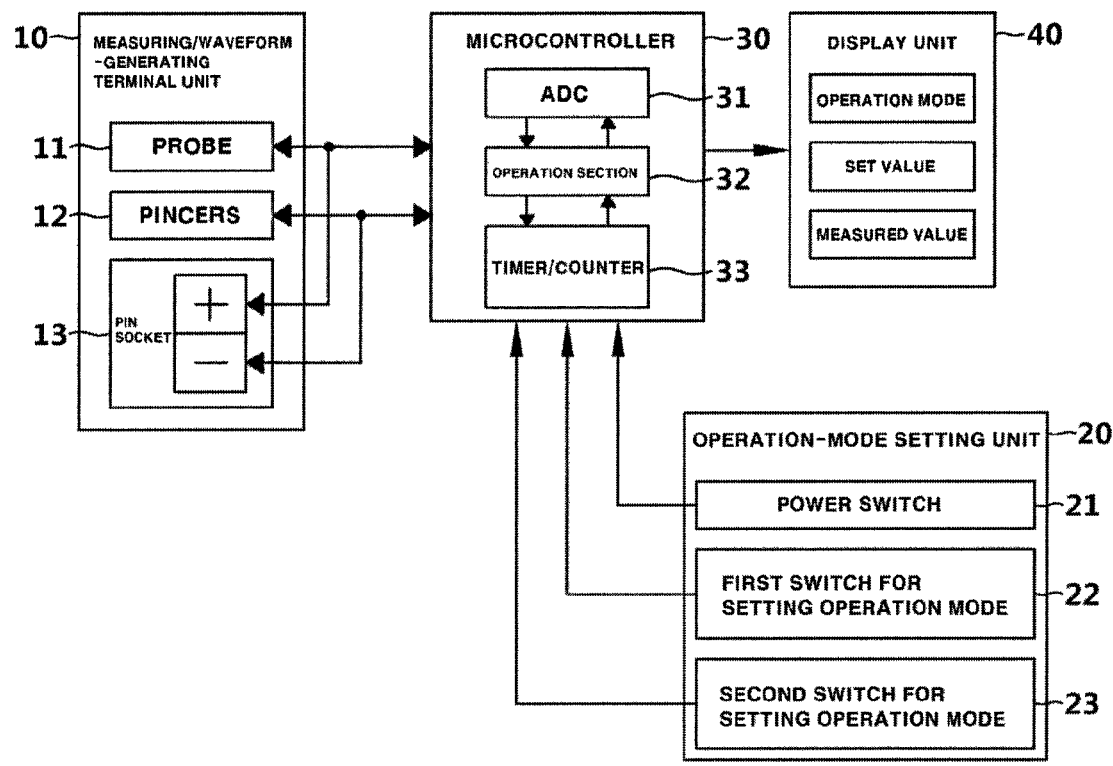
FIG. 3 illustrates a block view of the Multi-functional measuring and waveform-generating equipment with a probe illustrated in FIG. 1.

FIG. 3 illustrates a block view of the Multi-functional measuring and waveform-generating equipment with a probe illustrated in FIG. 1.

As illustrated, the Multi-functional measuring and waveform-generating equipment with a probe according to an exemplary embodiment of the present disclosure comprises:

a measuring/waveform-generating terminal unit 10, including:
    a probe 11 protruding from a front side of a body 14, connected with (+) pole of an object to be measured in measurement modes and providing (+) pole in waveform-generating modes; and
    pincers 12 extended from a side of the body 14 using a wire 12a, connected with (−) pole of the object to be measured in measurement modes and providing (−) pole in waveform-generating modes;
    a pin socket 13 formed at a side of the body 14, connected with the probe 11 and the pincers 12 electrically and providing the same functions as the functions that the probe 11 and the pincers 12 offer;
an operation-mode setting unit 20, receiving commands for turning a power on/off, and changing and setting an operation mode by a user;
a microcontroller 30, measuring electrical quantities from the object to be measured that is connected through the measuring/waveform-generating terminal unit 10 and controlling generation of a waveform thereof, according to the commands input from the operation-mode setting unit 20; and
a display unit 40, displaying measured quantities, information for generated waveforms, and operation modes that are controlled by the microcontroller 30.

Hereat, the operation modes which are input from the operation-mode setting unit 20 and controlled by the microcontroller 30, i.e., the measurement modes and the waveform-generating modes, comprise:
    modes of measuring a voltage, a resistance, an inductance, capacitance, a frequency, the number of pulses, the voltage level of a logic signal; distinguishing diode polarities, measuring the voltage level of a pulse signal; and
    modes of generating a rectangular pulse train and a PWM signal.

Further, the pin socket 13 of the measuring/waveform-generating terminal unit 10 may include (+) pole socket 13a and (−) pole socket 13b into which electrode wires of the object to be measured are inserted or to whom which waveforms generated by the microcontroller 30 are output.

The (+) pole socket 13a connected with the probe 11 internally is configured to:
    measure (+) pole of the object to be measured by being connected with (+) pole in the measurement modes, and
    provide (+) pole of a generated waveform in the waveform-generating modes.

The (−) pole socket 13b connected with the pincers 12 internally is configured to:
    measure (−) pole of the object to be measured by being connected with (−) pole of the object in the measurement modes, and
    provide (−) pole of a generated waveform in the waveform-generating modes.

The operation-mode setting unit 20 includes a power switch 21, a first and a second switches for setting operation mode 22, 23.

The power switch 21 turns a main power that supplies electrical power to the Multi-functional measuring and waveform-generating equipment with a probe on/off; and
    the first and the second switches for setting operation mode 22, 23 select any one among modes for measuring a voltage, a resistance, an inductance, capacitance, a frequency, the number of pulses, the voltage level of a logic signal, the voltage level of a pulse signal, and distinguishing diode polarities, or among modes for generating a rectangular pulse train, and generating a PWM signal, with combinations of the switches.

The body 14 is formed in a long stick shape or a pen shape, the power switch 21 is installed on a back side of the body 14, the display unit 40 is formed on the front side of the body 14, and the first and the second switches for setting operation a mode 22, 23 are formed to face each other on the both sides of the body 14.

Therefore, when a user holds the body 14 like using a usual pen, changing and setting an operation mode may be conveniently achieved because the first and the second switches for setting operation mode 22, 23 are located at the positions of a thumb and an index fingers of a user.

The microcontroller 30 includes an ADC 31, an operation section 32, and timer/counter 33.

The ADC 31 converts an analogue signal input from the object to be measured into a digital signal.

The operation section 32 calculates a voltage, a resistance, an inductance, capacitance, the voltage level of a logic signal, a frequency and a voltage across a diode based on the measured voltage that is input to the ADC 31.

Further, the operation section 32 generates a rectangular pulse train and a PWM signal and counts the number of pulses being input to the measuring/waveform-generating terminal unit 10 by using signals from the timer/counter 32.

The timer/counter 33 generates a timer interrupt and detects pulses being input to the measuring/waveform-generating terminal unit 10 so that the operation section 32 can perform the above-mentioned functions, according to installed program in the microcontroller 30.

The display unit 40 displays an operation mode, a set value and a measured voltage at the measuring moment on 7-segments or else.

Hereinafter, a method of operating the Multi-functional measuring and waveform-generating equipment with a probe according to an exemplary embodiment of the present disclosure will be described in detail as follows:

At first, a user turns a main power on/off by using the power switch 21 installed at a back side of the body 14.

Then, a method of changing and setting an operation mode under the main power turned on is as follows:

Every time the second switch for setting operation mode 23 is pressed and then released while the first switch for setting operation mode 22 is pressed, eleven modes (measuring a voltage, a resistance, an inductance, capacitance, a frequency, the number of pulses, the voltage level of a logic signal; distinguishing diode polarities, measuring the voltage level of a pulse signal, generating a rectangular pulse train, and generating a PWM signal) are changed in order repeatedly.

Hereat, the operation mode changing is displayed on the display unit 40 such as 7-segments.

Then, as a method of selecting a desired operation mode, while the first switch for setting operation mode 22 is being pressed, if the first switch for setting operation mode 22 is released, the operation mode displayed on the display unit 40 at the releasing moment is selected and the equipment operates in the selected mode.

The operation principles for the each mode of measuring a voltage, a resistance, an inductance, capacitance, a frequency, the number of pulses, the voltage level of a logic signal; distinguishing diode polarities, measuring the voltage level of a pulse signal, modes generating a rectangular pulse train, and generating a PWM signal will be described by referring to the attached Drawings in detail.

FIGS. 4a to 4k illustrate plan views of each operation principle for various operation modes of the present disclosure.

At first, as illustrated in FIG. 4a, the mode for measuring a voltage of the present disclosure is selected by manipulating the first and the second switches for setting operation mode 22, 23 and thereby "volt" is displayed on the display unit 40, as illustrated in the below Drawing.

In the mode of measuring a voltage of the present disclosure, the pincers 12 is connected to one end of a device, a circuit, or an object to be measured and the probe 11 is contacted to the other end of them. Hereat, the microcontroller 30 calculates the measured voltage value in a digital format after quantizing an analogue voltage from the input of the ADC 31; and the calculated value is displayed on the display unit 40 such as 7-segments. Thus, the voltage from the object to be measured may be conveniently measured. Hereat, the measurement range of a voltage should be 0 V to 5 V.

As illustrated in FIG. 4b, the mode of measuring a resistance of the present disclosure is selected by manipulating the first and the second switches for setting operation mode 22, 23 and thereby "res" is displayed on the display unit 40, as illustrated in the below Drawing.

In the mode of measuring a resistance of the present disclosure, when connecting both ends of a resistor to be measured with the pincers 12 and the probe 11, the microcontroller 30 applies a voltage to a resistor according to installed program in the microcontroller 30, and then calculates the voltage across the resistor by quantizing an analogue voltage that is input to the ADC 31 and using the voltage division formula. Thereby a resistance of the object to be measured would be easily measured by displaying the calculated voltage on the display unit 40. Hereat, the measurement range of a resistance should be 1 M$\omega$ to 10 M$\omega$.

As illustrated in FIG. 4c, the mode for measuring an inductance of the present disclosure is selected by manipulating the first and the second switches for setting operation mode 22, 23 and thereby "coil" is displayed on the display unit 40, as illustrated in the below Drawing.

In the mode of measuring an inductance of the present disclosure, when pressing the second switch for setting operation mode 23 after connecting both ends of inductor (not illustrated) to be measured with the pincers 12 and the probe 11, the display unit 40 is turned out and on in a moment, and then the measured inductance value is displayed on the display unit 40.

Hereat, the microcontroller 30 applies a voltage to the inductor and calculates an inductance value by measuring a time in which a voltage decreases using the timer/counter 32. The microcontroller 30 can conveniently measure the inductance of the object to be measured by displaying the inductance value on the display unit 40. Hereat, the measurement range of the inductance should be 0.1 mH to 999.9 mH.

As illustrated in FIG. 4d, the mode for measuring capacitance of the present disclosure is selected by manipulating the first and the second switches for setting operation mode 22, 23 and thereby "cap" is displayed at the display unit 40, as illustrated in the below Drawing.

In the mode of measuring capacitance of the present disclosure, when pressing the second switch for setting operation mode 23 after connecting both ends of capacitor (not illustrated) to be measured with the pincers 12 and the probe 11, the display unit 40 is turned out and on in a moment, and then the measured capacitance value is displayed on the display unit 40.

Hereat, the microcontroller 30 applies a voltage to the capacitor and calculates the capacitance by measuring the time in which a voltage increases using the timer/counter 33, and displays the measured capacitance on the display unit 40. Thus, the capacitance of the object to be measured may be easily measured and displayed. Hereat, the measurement range of the capacitance should be 10 μF to 200 μf.

As illustrated in FIG. 4e, the mode for measuring a frequency of the present disclosure is selected by manipulating the first and the second switches for setting operation mode 22, 23 and thereby "freq" is displayed on the display unit 40, as illustrated in the below Drawing.

In the mode of measuring a frequency of the present disclosure, when connecting (−) pole of the object to be measured with the pincers 12 and connecting (+) pole of the object with the probe 11, the microcontroller 30 may conveniently measure the signal frequency from the object by calculating the frequency value using an interrupt function of the timer/counter 33 and displaying the measured frequency on the display unit 40. Hereat, the measurement range of the frequency should be 1 Hz to 2 MHz.

As illustrated in FIG. 4f, the mode for counting the number of pulses of the present disclosure is selected by manipulating the first and the second switches for setting operation mode 22, 23 and thereby "cnt" is displayed on the display unit 40, as illustrated in the below Drawing.

In the mode of counting pulses of the present disclosure, when connecting (−) pole of the object to be measured with the pincers 12 and connecting (+) pole of the object with the probe 11, the microcontroller 30 calculates the number of pulses using interrupt function of the timer/counter 33 and displays the counted number of pulses on the display unit 40.

The number of the pulses ranges from 0 to 9999. Numbers exceeding the upper limit are displayed in such a way that number exceeding 9999 becomes 0 and next numbers increase thereon. Thus, the number of pulses from the object may be simply measured and displayed. While the pulses are being input, the number of measured pulses may be reset by pressing the first switch for setting operation mode 22. The measurement range of the pulse counter should be 0 to 9999.

As illustrated in FIG. 4g, the mode for measuring the level of a logic signal of the present disclosure is selected by manipulating the first and the second switches for setting operation mode 22, 23 and thereby "prob" is displayed on the display unit 40, as illustrated in the below Drawing.

In the mode of measuring the voltage level of a logic signal of the present disclosure, when connecting (−) pole of the object to be measured with the pincers 12 and connecting (+) pole of the object with the probe 11, the microcontroller 30 measures a logic value of a signal from the object to be measured by judging a voltage level of logic signal according to installed program in the microcontroller 30 and thereby displays the logic level on the display unit 40 using High or Low.

Hereat, in the mode of measuring the voltage level of a logic signal of the present disclosure, which uses the same principle as voltage measurements of the present disclosure, the microcontroller 30 calculates a voltage value in a digital format by quantizing the measured voltage that is input to the ADC 31; a logic level of the measured voltage is measured in such a way that 1.4 V or less is recognized as Low and that 2.5 V or more is recognized as High. Hereat, the measurement range of a logic signal should be 0 V to 5 V.

As illustrated in FIG. 4h, the mode of distinguishing diode polarities of the present disclosure is selected by manipulating the first and the second switches for setting operation mode 22, 23 and thereby "diod" is displayed on the display unit 40, as illustrated in the below Drawing.

In the mode of distinguishing diode polarities of the present disclosure, two electrode wires of a diode or a transistor (not illustrated) to be measured are inserted into each of (+) pole socket 13a and (−) pole socket 13b of the pin socket 13.

Hereat, the microcontroller 30 applies a voltage to the object to be measured and calculates a voltage across the PN junction of a diode or a transistor in a digital format after quantizing the measured voltage across the PN junction using the ADC 31. The microcontroller 30 displays the measured voltage on the display unit 40.

As described so far, the present disclosure measures a voltage across a PN junction and the voltage makes a PN junction of a diode or a transistor easily verified without checking a data sheet. That is, if the voltage applied to a PN junction is forward-biased, the measured voltage becomes as small as a forward bias voltage for the PN junction; if the voltage applied to the PN junction is reverse-biased, the measured voltage becomes as large as the voltage applied by the microcontroller 30. Thereby, the PN junction of a diode or a transistor can easily be verified.

As illustrated in FIG. 4i, the mode for measuring the voltage level of a pulse signal of the present disclosure is selected by manipulating the first and the second switches for setting operation mode 22, 23 and thereby "puls" is displayed on the display unit 40, as illustrated in the below Drawing.

In the mode of measuring the voltage level of a pulse signal of the present disclosure, when connecting (−) pole of the object to be measured with the pincers 12 and connecting (+) pole of the object with the probe 11, the microcontroller 30 measures an analogue voltage being input to the ADC 31 in a digital format according to installed program in the microcontroller 30, and then displays the measured voltage on the display unit 40 by classifying it into three values of 0 V, 2.5 V and 5 V. Thereby, the voltage level of a pulse signal from the object to be measured may be conveniently measured.

As illustrated in FIG. 4j, the mode for generating a rectangular pulse train of the present disclosure is selected by manipulating the first and the second switches for setting operation mode 22, 23 and thereby "sqr" is displayed on the display unit 40, as illustrated in the below Drawing.

In the mode of modes generating a rectangular pulse train of the present disclosure, the microcontroller 30 generates a rectangular pulse train using a timer interrupt function of the timer/counter 33 of which frequency is set by the operation-mode setting unit 20 and displays the frequency of a generated rectangular pulse train on the display unit 40.

Hereat, a rectangular pulse train is output between pincers 12/(−) pole socket 13b, and the probe 11/(+) pole socket 13a. When pressing the first switch for setting operation mode 22, the frequency of the rectangular pulse train increases and when pressing the second switch for setting operation mode 23, the frequency decreases. Hereat, voltage levels of the signal of the rectangular pulse train are 0 V and 5 V.

Figure 4K:

As illustrated in FIG. 4k, the mode for generating a PWM signal of the present disclosure is selected by manipulating the first and the second switches for setting operation mode 22, 23 and thereby "pun" is displayed on the display unit 40, as illustrated in the below Drawing.

In the mode of generating a PWM signal of the present disclosure, the microcontroller 30 generates a PWM signal using a timer interrupt of the timer/counter 33 of which a duty ratio is determined by the setting of the operation-mode setting unit 20 and displays the duty ratio of the PWM signal generated therein on the display unit 40. Hereat, a PWM signal is output between the pincers 12/(−) pole socket 13b and the probe 11/(+) pole socket 13a. When pressing the first switch for setting operation mode 22, the duty ratio of a PWM signal increases and when pressing the second switch for setting operation mode 23, the duty ratio decreases. Hereat, voltage levels of the PWM signal are 0V and 5V.

The methods displaying measurement and waveform-generating modes on the display unit 40 of the present disclosure are as follows: in case of the measurement modes, a value set by the operation-mode setting unit 20 is not displayed and only a measurement value is displayed on the display unit 40. However, in case of the waveform-generating modes, only a value set by the operation-mode setting unit 20 is displayed on the display unit 40.

Further, in the measurement modes, a measured value with three digits and its measurement unit are displayed on 7-segments. If a user wants to verify the fourth digit of the measured value, the second switch for setting operation mode 23 may be pressed and, in the case, the fourth digit of the measured value is displayed on the 7-segment allocated to a measurement unit In the measurement modes, if an object to be measured is not connected to the measuring/waveform-generating unit 10 or a measured value is not within the above-mentioned measurement ranges, an error message is displayed on the display unit 40.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A Multi-functional measuring and waveform-generating equipment with a probe, comprising:
    a measuring/waveform-generating terminal unit including:
        a probe protruding from a front side of a body, connected with (+) pole of an object to be measured in the measurement modes and providing (+) pole in the waveform-generating modes; and
        pincers extended from a side of the body using a wire, connected with (−) pole of the object to be measured in the measurement modes and providing (−) pole in the waveform-generating modes;
    an operation-mode setting unit receiving commands for turning a power on/off, setting an operation mode, and generating a desired waveform;
    a microcontroller, measuring electrical quantities of the object to be measured which is connected through the measuring/waveform-generating terminal unit and controlling the operation mode to generate a desired waveform, according to the setting of the operation-mode setting unit; and
    a display unit, displaying an operation mode, a set value, measured electrical quantities, and waveform-generating states.

2. The Multi-functional measuring and waveform-generating equipment with a probe, according to claim 1,
    wherein the operation mode that is input from the operation-mode setting unit, and controlled by the microcontroller comprises:
    modes of measuring a voltage, a resistance, an inductance, capacitance, a frequency, the number of pulses, the voltage level of a logic signal, distinguishing diode polarities, and measuring the voltage level of a pulse signal; and modes generating rectangular pulse train, and generating a PWM signal, for the object which is connected through the measuring/waveform-generating terminal unit.

3. The Multi-functional measuring and waveform-generating equipment with a probe, according to claim 1,
    wherein the measuring/waveform-generating terminal unit further comprises:
    a pin socket having (+) pole socket and (−) pole socket into which the electrode wires of the object to be measured are inserted;
        wherein the (+) pole socket connected with the probe electrically is configured to:
        be connected with (+) pole of the object to be measured in the measurement modes, and
        provide (+) pole in the waveform-generating modes, and
        wherein the (−) pole socket connected with the pincers electrically is configured to:
        be connected with (−) pole of the object to be measured in the measurement modes, and
        provide (−) pole in the waveform-generating modes.

4. The Multi-functional measuring and waveform-generating equipment with a probe, according to claim 1,
    wherein the operation-mode setting unit comprises:
    a power switch turning a main power on/off; and
    a first and a second switches for setting operation mode, selecting any one among modes for measuring a voltage, a resistance, an inductance, capacitance, a frequency, the number of pulses, the voltage level of a logic signal, distinguishing diode polarities, and measuring the voltage level of a pulse signal; and modes for generating a rectangular pulse train, and generating a PWM signal, by the combinations of the switches.

5. The Multi-functional measuring and waveform-generating equipment with a probe, according to claim 4,
    wherein the body is formed in a long stick shape,
    wherein the power switch is installed on a back side of the body, and
    wherein the display unit is formed on the front side of the body, and the first and the second switches for setting operation mode are formed to face each other on the both sides of the body.

6. The Multi-functional measuring and waveform-generating equipment with a probe, according to claim 1,
    wherein the microcontroller comprises:
    an ADC, converting an analogue signal which is input from the object to be measured into a digital signal;
    timer/counter, generating a timer interrupt according to installed program in the microcontroller and detecting a pulse input to the measuring/waveform-generating terminal unit; and
    an operation section, configured to:
    calculate a voltage, a resistance, an inductance, capacitance, the voltage level of a logic signal, a frequency, and a voltage across a diode using a measured voltage that is input to the ADC,
    count the number of pulses by receiving signals from the timer/counter, and
    generate a rectangular pulse train and a PWM signal.

7. The Multi-functional measuring and waveform-generating equipment with a probe, according to claim 1,
    wherein the display unit displays the operation mode controlled by the microcontroller, the set value from the operation-mode setting unit, measured electrical quantities, and measurement and waveform-generating states on 7-segments.

* * * * *

UNITED STATES PATENT AND TRADEMARK OFFICE
CERTIFICATE OF CORRECTION

| | | |
|---|---|---|
| PATENT NO. | : 9,097,742 B2 | |
| APPLICATION NO. | : 14/104885 | |
| DATED | : August 4, 2015 | |
| INVENTOR(S) | : Nam Tae Kim et al. | |

It is certified that error appears in the above-identified patent and that said Letters Patent is hereby corrected as shown below:

On the Title Page, in Item [73], under Assignee, at line 1, delete "INDE UNIVERSITY" and insert
-- INJE UNIVERSITY --

Signed and Sealed this
Twenty-second Day of March, 2016

Michelle K. Lee
*Director of the United States Patent and Trademark Office*